United States Patent [19]

Kondo

[11] Patent Number: 5,291,441
[45] Date of Patent: Mar. 1, 1994

[54] ELECTRICALLY PROGRAMMABLE READ ONLY MEMORY DEVICE WITH TIMING DETECTOR FOR INCREASING ADDRESS DECODING SIGNAL

[75] Inventor: Ichiro Kondo, Tokyo, Japan

[73] Assignee: NEC Corporation, Tokyo, Japan

[21] Appl. No.: 750,263

[22] Filed: Aug. 27, 1991

[30] Foreign Application Priority Data

Aug. 30, 1990 [JP] Japan .................................. 2-229991

[51] Int. Cl.$^5$ .............................................. G11C 7/00
[52] U.S. Cl. ........................... 365/189.01; 365/189.11; 365/900; 365/226
[58] Field of Search .............. 365/189.01, 201, 189.11, 365/900, 230.01, 210, 226

[56] References Cited

U.S. PATENT DOCUMENTS

| | | | |
|---|---|---|---|
| 4,503,522 | 3/1985 | Etoh et al. ................. | 365/189.11 X |
| 4,506,350 | 3/1985 | Asano et al. ........................ | 365/191 |
| 4,896,297 | 1/1990 | Miyatake et al. .............. | 365/189.11 |
| 5,031,149 | 7/1991 | Matsumoto et al. ................ | 365/226 |

FOREIGN PATENT DOCUMENTS 0181096  8/1991  Japan .................................. 365/201

Primary Examiner—Eugene R. LaRoche
Assistant Examiner—Son Dinh
Attorney, Agent, or Firm—Leydig, Voit & Mayer

[57] ABSTRACT

An electrically programmable read only memory device in a read-out mode of operation lifts one of the word lines to a read-out voltage level higher than an external power voltage level to see whether or not a designated floating gate type memory transistor provides a conductive channel, and the selected word line is firstly lifted to a first predetermined voltage level with a power voltage line, then being further lifted to the read-out voltage level supplied from a step-up circuit, wherein a monitoring unit is provided for the word lines for detecting the first predetermined voltage level so that an address set-up period is minimized without margin for fluctuation of process parameters.

6 Claims, 10 Drawing Sheets

ELECTRICALLY PROGRAMMABLE READ ONLY MEMORY DEVICE WITH TIMING DETECTOR FOR INCREASING ADDRESS DECODING SIGNAL

FIELD OF THE INVENTION

This invention relates to an electrically programmable read only memory device and, more particularly, to a timing generating circuit associated with an internal boosting circuit provided in association with an address decoding unit.

DESCRIPTION OF THE RELATED ART

The electrically programmable read only memory device has found a wide variety of application, and is manufactured as a single chip memory device and a built-in memory unit of, for example, a single chip microcomputer. In any application, the floating gate type field effect transistor shown in FIG. 1 is used as a programmable memory cell, and is fabricated on a lightly doped p-type silicon substrate 1. On the major surface of the silicon substrate 1 is selectively grown a thick field oxide film 2 which defines an active area for the programmable memory cells. N-type source/drain regions 3a, 3b and 3c are formed in the active area at spacing, and a lower gate oxide film 4 covers the active area. Floating gate electrodes 5a and 5b are provided over channel forming regions between the source/drain regions 3a to 3c, and the floating gate electrodes 5a and 5b are covered with upper gate oxide films 6a and 6b, respectively. Controlling gate electrodes 7a and 7b are provided over the upper gate oxide films 6a and 6b, and an inter-level insulating film 8 covers the silicon substrate 1 as well as the controlling gate electrodes 7a and 7b. A contact hole is formed in the inter-level insulating film 8, and reaches the source/drain region 3b. A digit line 9 passes through the contact hole, and is held in contact with the source/drain region 3b. The source/drain regions 3a and 3b, the lower gate oxide film 4, the floating gate electrode 5a, the upper gate oxide film 6a and the controlling gate electrode 7a as a whole constitute a floating gate type field effect transistor M1, and the source/drain regions 3b and 3c, the lower gate oxide film 4, the floating gate electrode 5b, the upper gate oxide film 6b and the controlling gate electrode 7b also constitute another floating gate type field effect transistor M2.

The source/drain regions 3a and 3b are coupled with a ground line, and the controlling gate electrodes are gated by a row address decoding unit (not shown). The programmable memory cell implemented by the floating gate type field effect transistor memorizes a data bit of logic "1" or "0" level, and the logic level of the data bit corresponds to the threshold level of the floating gate type field effect transistor. Namely, if an extremely high voltage level is applied to the digit line 9, the p-n junction between the source/drain region 3b and the silicon substrate 1 is reversely biased, and hot electrons are produced therearound. In order to shift the floating gate type field effect transistor M1 into a write-in state, a positive high voltage level is applied to the controlling gate electrode 5a, and the hot electrons are injected into the floating gate electrode 5a. The hot electrons thus accumulated in the floating gate electrode 5a increases the threshold level, and the floating gate type field effect transistor M1 hardly turns on with a read-out voltage level at the controlling gate electrode 6a. However, if the floating gate type field effect transistor M1 is exposed to ultra-violet radiation, the hot electrons are evacuated from the floating gate electrode 5a, and the threshold level becomes low enough to allow the floating gate type field effect transistor M1 to turn on with the read-out voltage level at the controlling gate electrode 7a. The two threshold levels are indicative of logic "1" and "0" levels, and the threshold level of the floating gate type field effect transistor M1 is detectable as the voltage level on the bit line 9. In order to effectively inject the hot electrons into the floating gate electrode 5a, the source/drain region 3b is reversely biased until pinch-off phenomenon takes place, and the heavily doped p-type channel forming region allows the p-n junction to rapidly reach the pinch-off point. However, the heavily doped p-type channel forming region elevates the threshold level of the floating gate type field effect transistor M1.

In general, a designer usually targets the threshold level of the floating gate type field effect transistor M1 for about 2.0 volts, however, margin is necessary for the read-out voltage level because of dispersion in the fabricating process as well as difference in practical ambience such as temperature. For this reason, the threshold level of the floating gate type field effect transistor M1 is regulated to about 2.5 volts.

If the electrically programmable read only memory device is incorporated in a single chip microcomputer for providing an instruction set storage, the electrically programmable read only memory device is expected to respond to a high frequency clock signal of the order of 4 MHz, and data bits forming an instruction code are needed to be fetched within hundreds nanoseconds. Moreover, even if there is dispersion of the threshold levels, the voltage level on the digit line 9 is expected to be stable for exact discrimination of the logic level, and, for this reason, the amount of drain current should be relatively large. Thus, there are various requirements for the electrically programmable read only memory device, and a relatively low external power voltage level of 2.0 volts hardly satisfies the requirements. This means that a higher voltage level than the external power voltage level is necessary for the electrically programmable read only memory device.

In order to produce a higher voltage level than the external power voltage level of about 2.0 volts, the electrically programmable read only memory device is equipped with a step-up circuit, and the step-up circuit boosts up to about 4 to 5 volts. The boosted power voltage level is supplied to a controlling gate electrode of a selected floating gate type field effect transistor, and current of about 10 micro-ampere flows from the associated row address decoding unit to the word line coupled with the selected floating gate type field effect transistor. However, if the step-up circuit fully participates the driving operation of the word line, the current of the order of 10 micro-ampere tends to fluctuate upon switching action of complementary logic gates used in the row address decoding unit due to through-current passing through the complementary logic gates, and, for this reason, hardly imparts stability to the discrimination of the logic level. For enhancing the stability of the discrimination, the prior art electrically programmable read only memory device firstly selects a word line from the n word lines, and elevates the selected word line to the power voltage level supplied from the outside thereof, then boosting up to the output voltage level of the step-up circuit. FIG. 2 shows a typical example of the double step-up configuration incorporated in the prior art electrically programmable read only memory device. Referring to FIG. 2, floating gate type field effect transistors M11 and M12 share a word line WL, and are respectively associated with digit lines DL1 and DL2. The word line WL is coupled at one end thereof with a row address decoding unit 21 and at the other end thereof with a selecting unit 22, and the row address decoding unit 21 assigns a series combination of a NAND gate 21a, an inverting circuit 21b and an n-channel enhancement type transfer gate transistor 21c to the word line WL. The selecting unit 22 is coupled with the output node 23 of a step-up circuit, and is implemented by a series combination of p-channel enhancement type field effect transistors 23a, 23b, 23c, 23d and 23e. The NAND gate 21a decodes internal row address bits RD, and drives the word line WL when the row address bits are indicative of the word line WL. The selecting unit 22 are also responsive to the internal row address bits, and transfers the output voltage level of the step-up circuit to the word line WL when a timing signal TM is in an active low voltage level.

The double step-up operation is illustrated in FIG. 3 of the drawings. Assuming now that the internal row address bits are changed to the address indicative of the word line WL at time t1, the NAND gate 21a decays the output voltage level to the low voltage level at time t2, and the inverting circuit 21b starts on lifting the word line WL at time t3. The word line WL reaches the external power voltage level PV1 around time t4. The n-channel enhancement type field effect transistors 23a to 23d have already turned on with the internal row address bits RD, and the timing signal TM is shifted to the active low voltage level at time t5. Then, the output node 23 of the step-up circuit is coupled through the series combination of the n-channel enhancement type field effect transistors 23a to 23e with the word line WL, and the word line WL is boosted up toward the output voltage level PV2 of the step-up circuit. The time period T1 between time t1 to time t5 is referred to as "address set-up period", and the term T2 after time t5 is called as "charge-up period".

The double step-up of the selected word line decreases the load of the step-up circuit, and enhances the stability. In detail, the load of the step-up circuit is calculated by Equation 1 with the assumption that the external power voltage level PV1 is about 2.0 volts, the parasitic capacitance coupled to the selected word line WL is about 2 pF, the output voltage level PV2 is about 4.0 volts and access to the data bits is repeated at interval of about 1 microsecond.

$$(4.0 \text{ volts} - 2.0 \text{ volts}) \times (2 \times 10^{-12} F \times 1/10^6 \text{ second}) = 4 \times 10^{-6} \text{ ampere} \ldots \quad \text{Equation 1}$$

The step-up circuit is large enough to supply the current of the order of $4 \times 10^{-6}$ ampere without fluctuation upon switching action of the row address decoding unit 21a, and a read-out unit exactly discriminates the logic level on the basis of the voltage level on the associated digit line DL1 or DL2.

Thus, the double step-up operation is desirable for stability of the discrimination of the logic level, however, a problem is encountered in that the address set-up period tends to be prolonged. If the prior art electrically programmable read only memory device serves as a built-in instruction code storage, the timing signal TM is produced by using a synchronizing clock signal, and is supplied to the p-channel enhancement type field effect transistor 23e exactly at time t5. However, if the synchronizing clock signal is not available, a built-in delay circuit usually produces the timing signal TM, and the delay produced by the built-in delay circuit is not constant due to fluctuation of the external power voltage level, process parameters, temperature and so forth. This results in that an appropriate margin is taken into account, and the address set-up period tends to be prolonged. Such a long address set-up period is not desirable for a high speed read-out operation. If, on the other hand, the address set-up period is too short to reach the external power voltage level, the load of the step-up circuit becomes large, and the discrimination tends to be unstable.

Another prior art electrically programmable read only memory device is illustrated in FIG. 4 and fabricated on a single p-type silicon substrate 41. The electrically programmable read only memory device shown in FIG. 4 is of the type electrically erasable. Although a high threshold voltage level and a low threshold voltage level usually correspond to an erased state and a write-in state of the electrically erasable and programmable read only memory device, the relation between the states and the threshold levels are caused to be consistent with that of the electrically programmable read only memory device shown in FIG. 1 for elimination of confusion, and, for this reason, terms "erased state" and "write-in state" in the following description mean a low threshold level and a high threshold level, respectively. A thick field oxide film 42 is selectively grown on the major surface of the p-type silicon substrate 41, and heavily doped n-type source/drain regions 42a, 42b, 42c, 42d and 42e are formed in the surface region at spacing. A relatively thin gate oxide film 43 covers the surface of the p-type substrate 41, and has extremely thin portions 43a and 43b of about 100 angstroms around the p-n junctions between the n-type source/drain regions 42b and 42d and the p-type substrate 41. Floating gate electrodes 44a and 44b are provided over the channel forming regions between the n-type source/drain regions 42a/42e and 42b/42d, and gate electrodes 45a and 45b are formed over the channel forming regions between the n-type source/drain region 42c and the n-type source/drain regions 42b/42d. The floating gate electrodes 44a and 44b are covered with upper gate oxide films 46a and 46b, respectively, and controlling gate electrodes 47a and 47b are respectively provided on the upper gate oxide films 46a and 46b, respectively. An inter-level oxide film 48 covers the controlling gate electrodes 47a and 47b as well as the gate electrodes 45a and 45b, and a contact hole projects onto the n-type source/drain region 42c. A digit line 49 passes through the contact hole, and is held in contact with the n-type source/drain region 42c. The n-type source/drain regions 42b and 42c, the gate oxide film 43 and the gate electrode 45a form in combination a switching transistor SW11, and the n-type source/drain regions 42a and 42b, the gate oxide film 43, the floating gate electrode 44a, the upper gate oxide film 46a and the controlling gate electrode 47a provide a floating gate type field effect transistor FT11. The switching transistor SW11 and the floating gate type field effect transistor FT11 as a whole constitute an electrically programmable memory cell M11.

The switching transistor SW11 and the floating gate type field effect transistor FT11 thus serially coupled is further associated with a switching transistor SW12 which is coupled between an associated word line WL11 and the controlling gate electrode 47a of the floating gate type field effect transistor FT11 as shown in FIG. 5. In order to cause the electrically programmable read only memory device to enter a write-in state, the switching transistors SW11 and SW12 fully turn on with an extremely high positive voltage level, and the digit line 49 and the controlling gate electrode 47a are also elevated to an extremely high write-in voltage level. Fowler-Nordheim tunneling current flows into the floating gate electrode 44a, and gate voltage-to-drain current characteristics is changed from plots A to plots B as shown in FIG. 6.

While the electrically programmable read only memory device remains in the erased state, a large amount of drain current flows from the digit line 49 through the electrically programmable read only memory device in the presence of a read-out voltage level $V_{RD}$ at the controlling gate electrode 47a applied from a row address decoder (not shown) through the word line WL11. However, if the electrically programmable read only memory device enters the write-in state, no current flows therethrough in the presence of the read-out voltage level $V_{RD}$ at the controlling gate electrode 47a. A sense amplifier circuit (not shown) is associated with the digit line 49, and discriminates the state of the electrically programmable read only memory device, i.e., the write-in state or the erased state. It is desirable for the read-out voltage level $V_{RD}$ to adjust the mid point between the threshold voltage level in the erased state and the threshold voltage level in the write-in state, because the electrically programmable read only memory device is hardly affectable by fluctuation of the threshold level. However, gap GP1 indicative of difference in current should be regulated to a predetermined value on the basis of the associated sense amplifier circuit.

Thus, the electrically programmable read only memory device shown in FIG. 4 needs an exactly regulated read-out voltage level RD, and the read-out voltage level $V_{RD}$ is of the order of about 1.0 volt, and a power voltage line (not shown) supplies read-out current to the digit line 49 for discriminating the state of the electrically programmable read only memory device. In order to transfer the read-out voltage level $V_{RD}$ to the controlling gate electrode 47a, back-gate biasing effect is taken into account, and the switching transistors SW11 and SW12 are supplied with about 2.0 volts.

Though not shown in the drawings, the double step-up operation is achieved by the row address decoder, and the word line WL is firstly lifted to the external power voltage level, then being boosted to the read-out voltage level $V_{RD}$ as high as PV2 in FIG. 3. This means that the prior art electrically programmable read only memory device shown in FIG. 4 encounters the same problem as the prior art electrically programmable read only memory device shown in FIG. 1, and the address set-up period tends to be prolonged due to fluctuation of delay time.

SUMMARY OF THE INVENTION

It is therefore an important object of the present invention to provide an electrically programmable read only memory device which shrinks the address set-up period without sacrifice of reliability of the discrimination of logic level.

To accomplish the object, the present invention proposes to monitor a selected word line to see whether or not the voltage level thereof reaches a target level.

In accordance with one aspect of the present invention, there is provided an electrically programmable read only memory device comprising a) a plurality of memory cells arranged in rows and columns and respectively storing data bits, each of said plurality of memory cells being implemented by a field effect transistor having a source node coupled to a ground voltage line, a floating gate electrode covered with insulating film and provided between a channel forming region, a controlling gate electrode, and a drain node, b) a plurality of word lines respectively associated with said rows of said memory cells and coupled with controlling nodes of said memory cells in said associated rows, c) a plurality of digit lines respectively associated with said columns of said memory cells and coupled to second nodes of said memory cells in said associated columns, d) a row address decoding unit responsive to internal row address bits and shifting one of said plurality of word lines to a target voltage level, lower than a positive external power voltage level supplied from the outside thereof, e) a monitoring unit for monitoring said one of said plurality of word lines to see whether or not said one of said plurality of word lines reaches said target voltage level for producing a determining signal indicative of reaching said target voltage level, including a plurality of inverting circuits respectively coupled to said word lines, each of said plurality of inverting circuits having a threshold level as high as said target voltage level for producing said detecting signal, f) step-up means responsive to said detecting signal and allowing said one of said plurality of word lines to exceed said target voltage level toward a predetermined voltage level larger in magnitude than said target voltage level, said one of said plurality of word lines allowing memory cells coupled thereto to enter a ready state, said step-up means comprising a step-up circuit supplied with said positive external power voltage level and producing said predetermined voltage level, a plurality of first switching transistors coupled with said word lines, respectively, and responsive to said detecting signal for producing conductive channels, and a selecting unit having a plurality of selecting circuits respectively associated with said plurality of word lines and responsive to said internal row address bits for interconnecting said step-up circuit and one of said plurality of first switching transistors, g) column selecting means responsive to internal column address bits and selecting one of said digit lines, and h) read-out means for discriminating a logic level of one of said data bits read out from one of said memory cells coupled to said one of said plurality of word lines and said one of said plurality of digit lines.

BRIEF DESCRIPTION OF THE DRAWINGS

The features and advantages of the electrically programmable read only memory device according to the present invention will be more clearly understood from the following description taken in conjunction with the accompanying drawings in which.

DESCRIPTION OF THE PREFERRED EMBODIMENTS

First Embodiment

Figure 1:
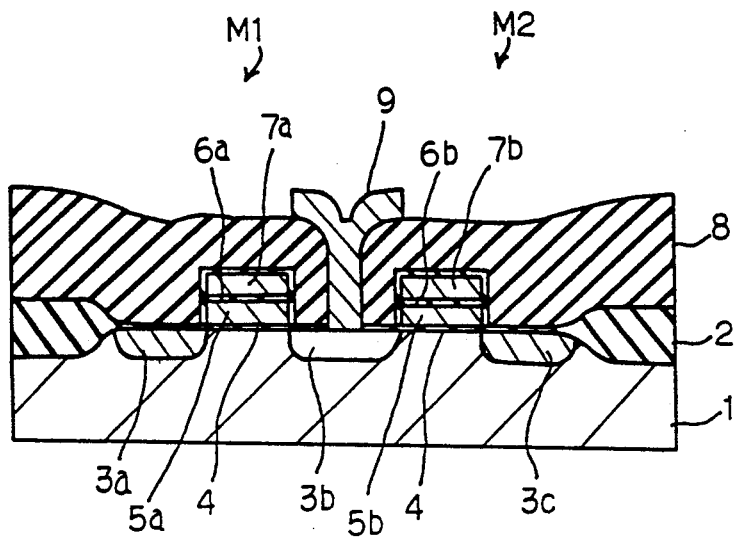
FIG. 1 is a cross sectional view showing the structure of the floating gate type field effect transistor used as the prior art electrically programmable memory cell.
Figure 2:
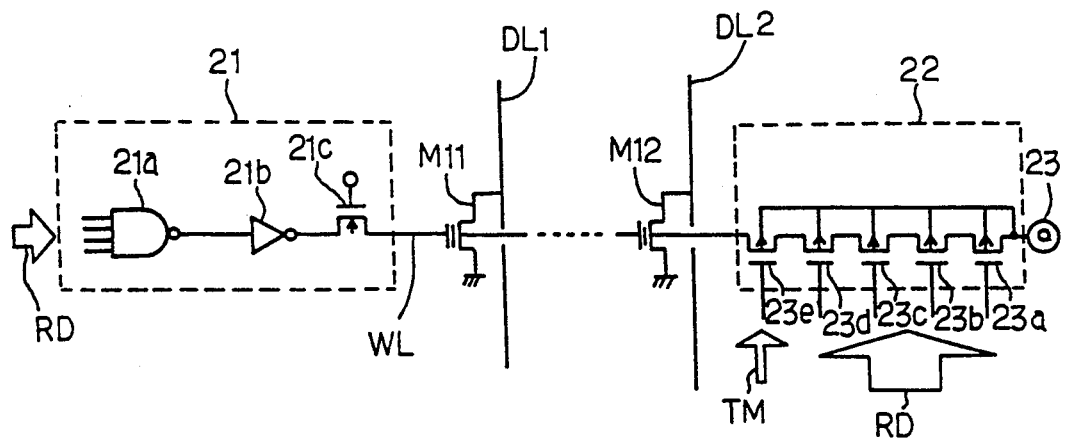
FIG. 2 is a circuit diagram showing the arrangement of a row of electrically programmable memory cells incorporated in the prior art electrically programmable read only memory device for the double step-up operation.
Figure 3:
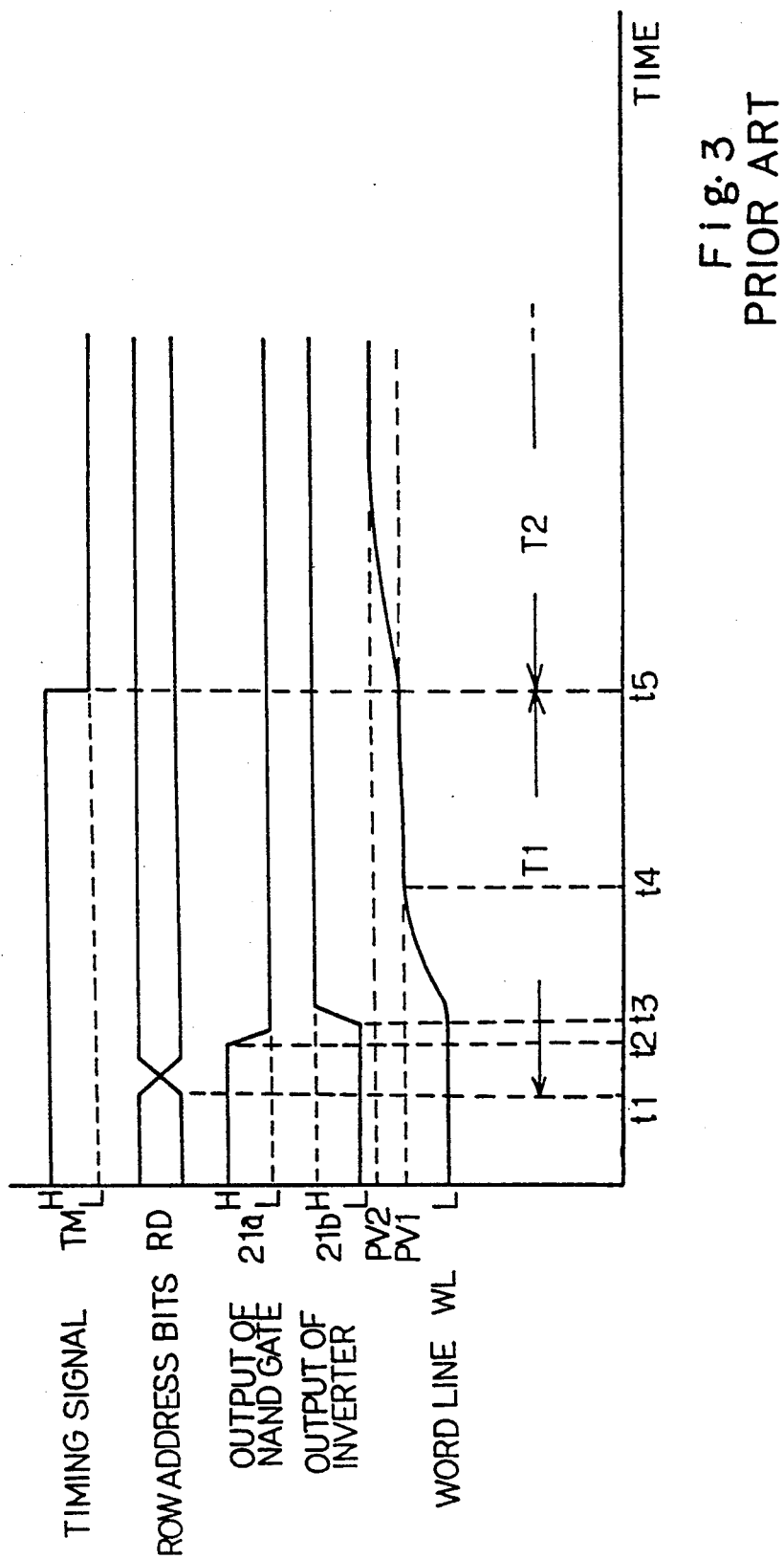
FIG. 3 is a timing chart showing the double step-up operation on the row of electrically programmable memory cells shown in FIG. 2.
Figure 4:
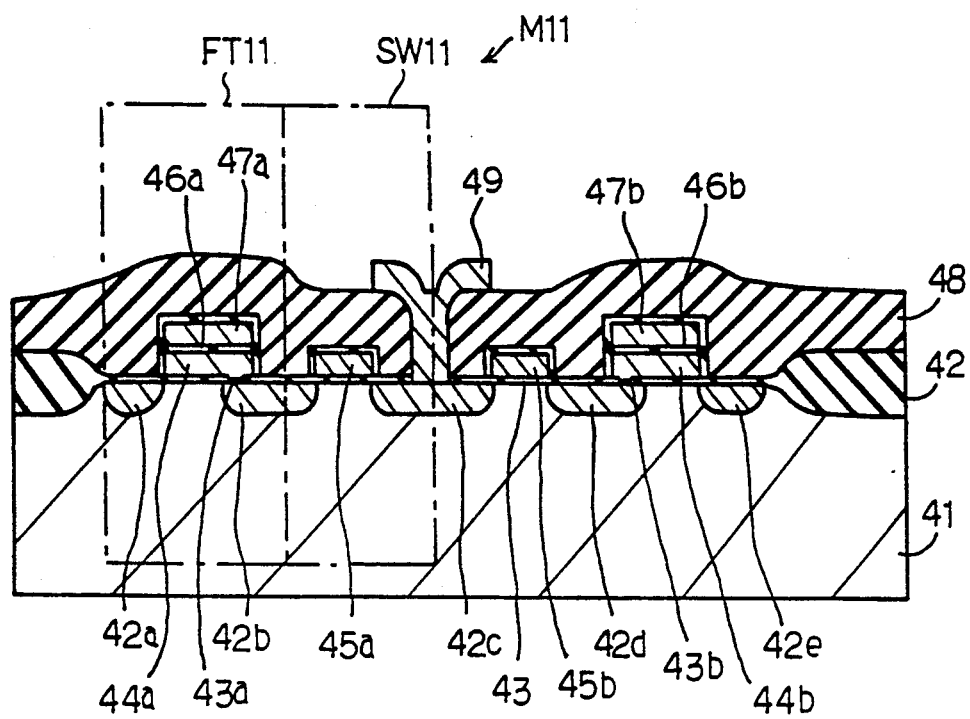
FIG. 4 is a cross sectional view showing the structure of another prior art electrically programmable memory cell.
Figure 5:
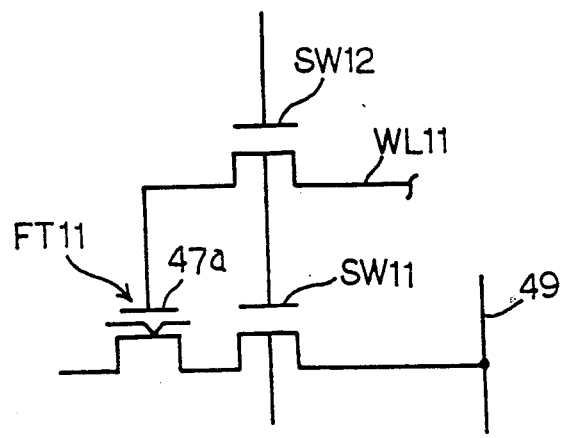
FIG. 5 is an equivalent circuit diagram showing the arrangement around the electrically programmable read only memory cell shown in FIG. 4.
Figure 6:
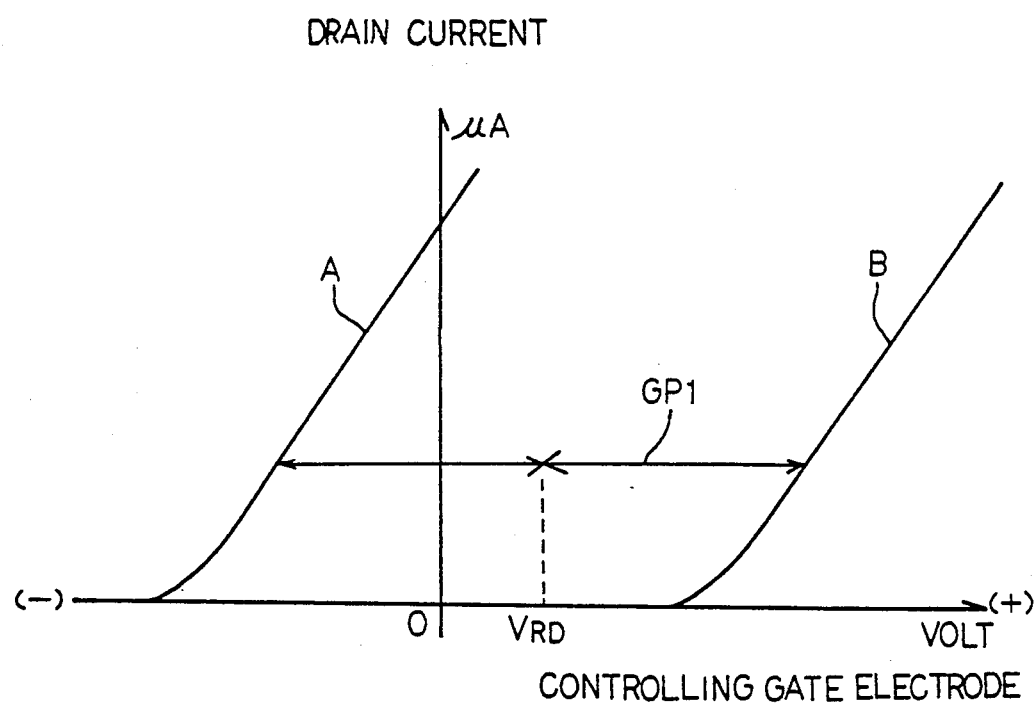
FIG. 6 is a graph showing drain current in terms of voltage level at a controlling gate electrode of the prior art electrically programmable read only memory device shown in FIG. 4.
Figure 7:
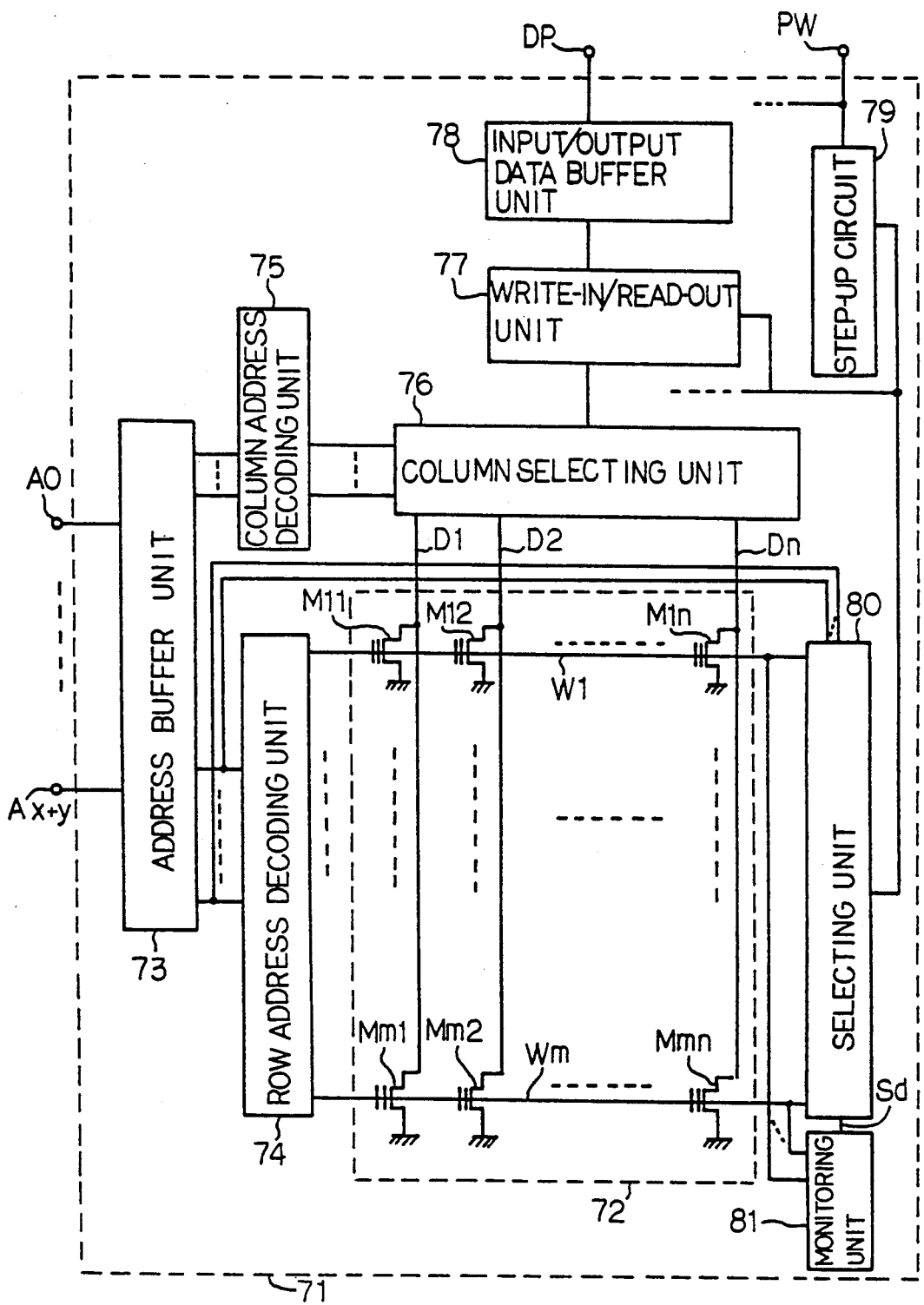
FIG. 7 is a block diagram showing the arrangement of an electrically programmable read only memory device according to the present invention.

Referring to FIG. 7 of the drawings, an electrically programmable read only memory device embodying the present invention is fabricated on a single semiconductor chip 71, and largely comprises a memory cell array 72, and various peripheral units. The memory cell array 72 is implemented by a plurality of memory cells M11, M12, M1n, Mm1, Mm2 and Mmn arranged in rows and columns, and the memory cells M11 to Mmn are of an n-channel floating gate type field effect transistor. Each of the memory cells M11 to Mmn has a floating gate electrode, a controlling gate electrode serving as a controlling node, a source node serving as a first node, and a drain node serving as a second node. A plurality of word lines W1 to Wm are respectively associated with the rows of the memory cells M11 to Mmn, and the controlling gate electrodes of the memory cells M11 to Mmn in the rows are coupled to the associated word lines W1 to Wm. A plurality of digit lines D1, D2 and Dn are further associated with the columns of the memory cells M11 to Mmn, and the drain nodes of the memory cells M11 to Mmn in the columns are coupled to the associated digit lines D1, D2 and Dn.

The peripheral units include an address buffer unit 73 coupled to address pins A0 to Ax+y, a row address decoding unit 74, a column address decoding unit 75, a column selecting unit 76, a write-in/read-out unit 77, an input/output data buffer unit 78 coupled to an input/output data pin DP, a step-up circuit 79 coupled to an external power voltage pin PW, a selecting unit 80, and a monitoring unit 81.

The address pins A0 to Ax+y are applied with row address bits and column address bits, and the row and column address bits are temporally stored in the address buffer unit 73. The address buffer unit 73 produces the complementary row address bits and the complementary column address bits, and selectively supplies the row address bits and the complementary row address bits thereof to the row address decoding unit 74. The row address decoding unit 74 is responsive to the row address bits and the complementary row address bits, and lifts one of the word lines W1 to Wm to a first predetermined voltage level Vpd1 slightly lower than an external power voltage level Vcc of about 2.0 volts applied to the external power voltage pin PW as described hereinafter. The monitoring unit 81 monitors the word lines W1 to Wm to see whether or not one of the word lines W1 to Wm reaches a target voltage level slightly lower than the first predetermined voltage level Vpd1. However, it is desirable for the target voltage level to be closer to the first predetermined voltage level Vpd1, and the target voltage level may be as high as the first predetermined voltage level Vpd1. When the selected word line reaches the target voltage level, the monitoring unit 81 produces a detecting signal indicative of reaching the target voltage level. The row address bits and the complementary row address bits are further supplied to the selecting unit 80, and the selecting unit 80 is also responsive to the row address bits and the complementary row address bits for interconnecting the output node of the step-up circuit 79 and the selected word line.

The step-up circuit 79 produces at least two voltage levels higher than the external power voltage level Vcc. Namely, the step-up circuit 79 produces a read-out voltage level Vrd higher than the external power voltage level Vcc and a write-in voltage level much higher than the external power voltage level Vcc. In this instance, the read-out voltage level Vrd is adjusted to about 4.0 volts.

When the selecting unit 80 interconnects the output node of the step-up circuit 79 and the selected word line, the selected word line is elevated toward the write-in voltage level or the read-out voltage level Vrd, and, for this reason, one of the write-in voltage level and the read-out voltage level Vrd serves as a second predetermined voltage level. Upon reaching the second predetermined voltage level, the memory cells coupled to the selected word line enter a ready state where a write-in operation and a read-out operation are selectively carried out. In this instance, the step-up circuit 79 and the selecting unit 80 as a whole constitute a step-up means. The row address bits and the complementary row address bits serve as internal row address bits, and the column address bits and the complementary column address bits serve as internal column address bits.

The column address decoding unit 75 is responsive to the column address bits and the complementary column address bits, and causes the column selecting unit 76 to interconnect the write-in/read-out unit 77 and one of the digit lines D1 to Dn. The write-in/read-out unit 77 supplies a write-in voltage level and a read-out current through the column selecting unit 76 to one of the digit lines D1 to Dn, and the write-in operation and the read-out operation are selectively carried out for one of the memory cells M11 to Mmn coupled to the selected word line and the selected digit line. Namely, the write-in/read-out unit 77 supplies either write-in or ground voltage level to the selected digit line depending upon the logic level of an input data bit at the input/output data buffer unit 78 in the write-in operation. However, if the electrically programmable read only memory device is in the read-out operation, the write-in/read-out unit 77 supplies the read-out current to the selected digit line, and discriminates the state of the selected memory cell on the basis of the voltage level at the selected digit line. In this instance, the column address decoding unit 75 and the column selecting unit 76 as a whole constitute column selecting means, and the input-/output data buffer unit 78 and the write-in/read-out unit 77 serve as read-out means.

Figure 8:
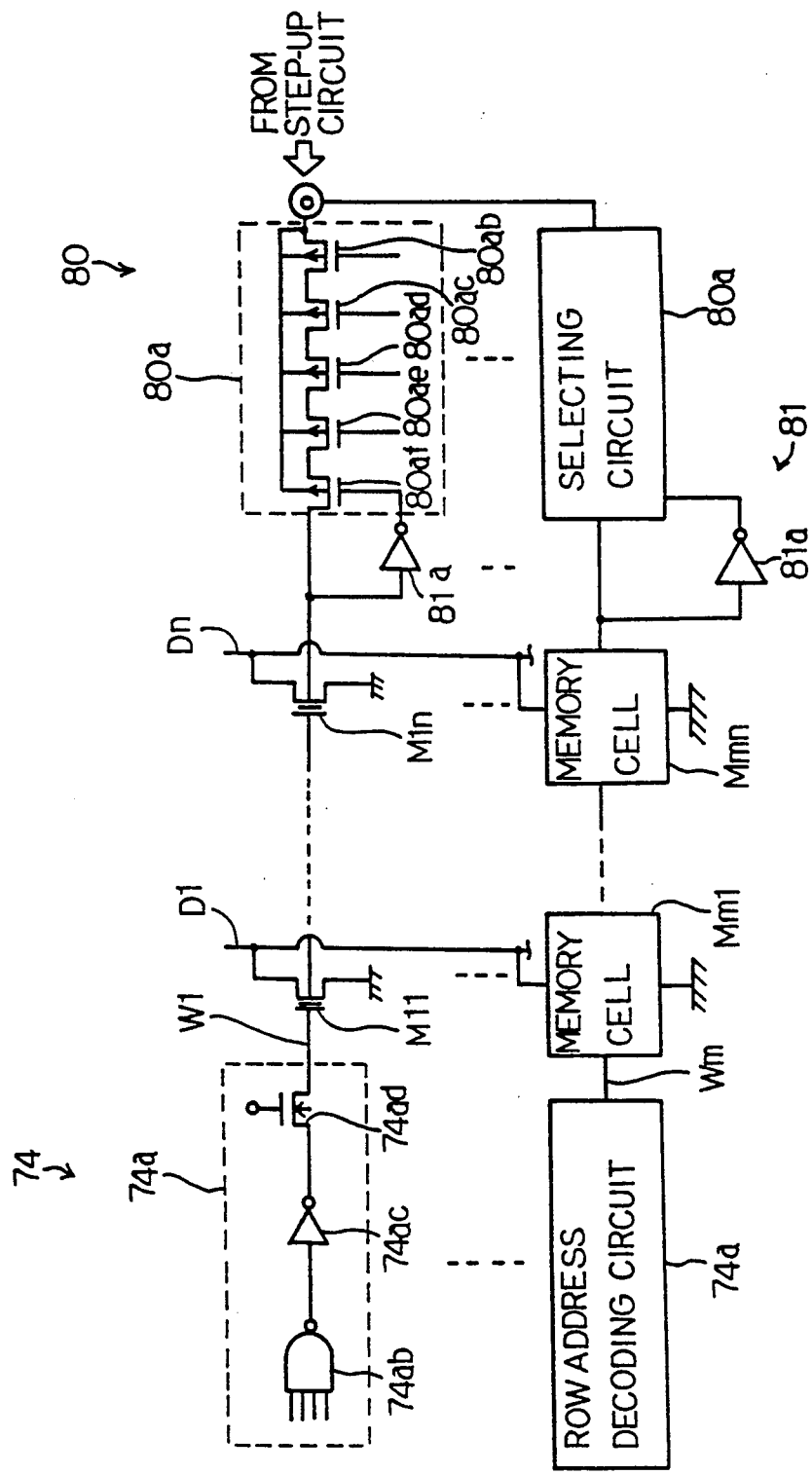
FIG. 8 is a circuit diagram showing in detail the circuit arrangement associated with one of the word line incorporated in the electrically programmable read only memory device shown in FIG. 7.

Turning to FIG. 8, a row of the memory cells M11 to M1n coupled to the word line W1 is illustrated in detail. A row address decoding circuit 74a incorporated in the row address decoding unit 74 is provided in association with the word line W1, and comprises a NAND gate 74ab selectively supplied with the row address bits and/or the complementary row address bits, an inverting circuit 74ac supplied with a decoding signal from the NAND gate 74ab and an n-channel enhancement type transfer transistor 74ad responsive to an internal timing signal produced by a timing generating unit (not shown), and the n-channel enhancement type transfer transistor 74ad is provided for isolating a power voltage line propagating the external power voltage Vcc from the read-out voltage level Vrd, and the word line W1 can not exceed the first predetermined voltage level Vpd1 lower than the external power voltage level Vcc by the threshold level of the n-channel enhancement type transfer transistor 74ad.

A selecting circuit 80a of the selecting unit 80 is also associated with the word line W1, and comprises a series combination of p-channel enhancement type field effect transistors 80ab, 80ac, 80ad, 80ae and 80af coupled between the output node of the step-up circuit 79 and the word line W1, and the row address bits and/or the complementary row address bits are selectively supplied to the gate electrodes of the p-channel enhancement type field effect transistors 80ab to 80ae. The p-channel enhancement type field effect transistors 80ab to 80af are formed in an n-type well (not shown) which is biased by the output node of the step-up circuit 79, and back-gate biasing phenomenon takes place at the p-channel enhancement type field effect transistors 80ab to 80af. A p-channel enhancement type field effect transistor formed in an n-type well is usually as small in threshold level as −0.7 volt, because the channel region is doped with p-type impurities. However, the channel regions of the p-channel enhancement type field effect transistor 80af is smaller in doping level than the usual p-type enhancement type field effect transistor, and is as large in threshold level as about −2.0 volts. The series combination of the p-channel enhancement type field effect transistors 80ab to 80af allows the word line W1 to reach the second predetermined voltage level or the read-out voltage level Vrd without substantial voltage drop. The monitoring unit 81 is implemented by a plurality of inverting circuits respectively coupled with the word lines W1 to Wm, and an inverting circuit 81a is provided for the word line W1. The inverting circuits 81a are adjusted to have a threshold voltage level as high as the target voltage level. The monitoring unit 81 behaves with the external power voltage level Vcc, and supplies the output signal thereof to the p-channel enhancement type field effect transistor 80af so as to switch the transistor 80af. Every word line W2 to Wm is also associated with a row address decoding circuit, a selecting circuit and an inverting circuit, and the row address decoding circuit, the selecting circuit and the inverting circuit are similar to those of the word line W1. For this reason, they are labeled with the same references in FIG. 8.

Figure 9:
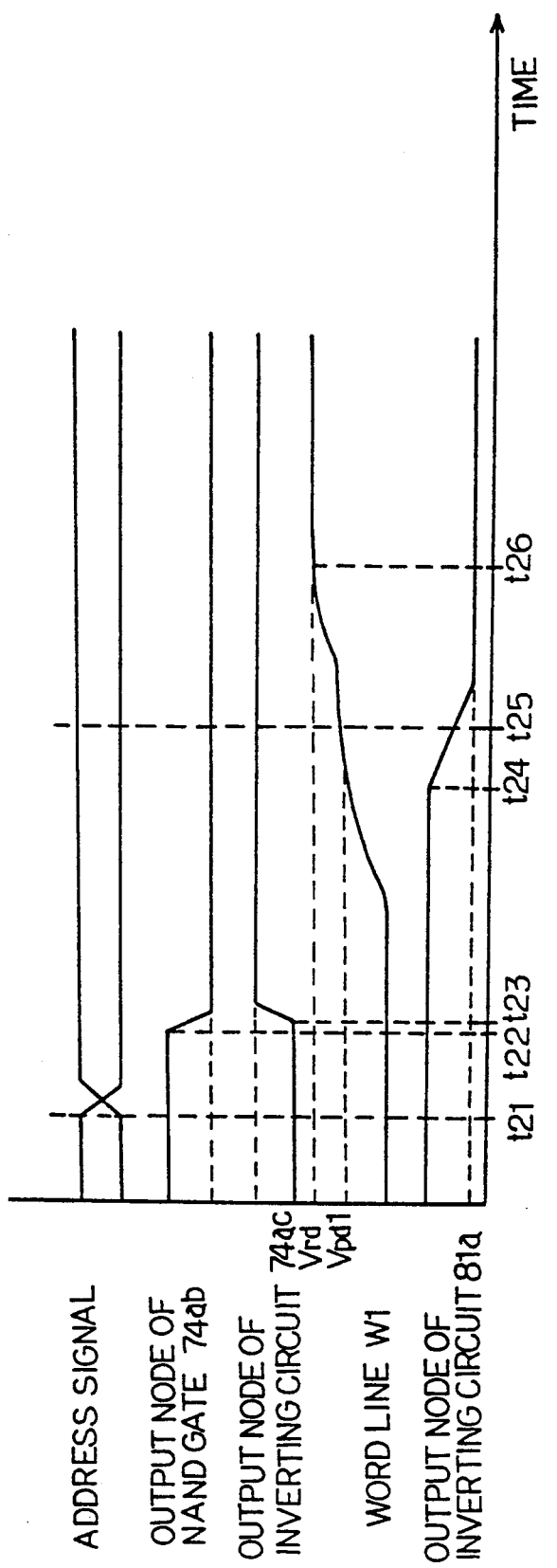
FIG. 9 is a timing chart showing a sequence of the read-out operation carried out by the electrically programmable read only memory device shown in FIG. 7.

FIG. 9 shows a sequence of a read-out operation on the assumption that the memory cell M11 is accessed. The address signal is changed to the address assigned the memory cell M11 at time t21, and the NAND gate 74ab decodes the row address bits, thereby shifting the output node thereof to the low voltage level at time t22. The inverting circuit 74ac starts on lifting the output node thereof toward the external power voltage level Vcc at time t23, and the n-channel enhancement type transfer transistor 74ad turns on to transfer the voltage level at the output node of the inverting circuit 74ac. However, the word line W1 merely increases the voltage level to the first predetermined voltage level Vpd1 due to the threshold level of the n-channel enhancement type transfer transistor 74ad. If the word line W1 reaches the target voltage level at time t24, the monitoring unit 81 or the inverting circuit 81a inverts the voltage level at the output node thereof, and the output node thereof is decayed towards the threshold level of the p-channel enhancement type field effect transistor 80af. The output node of the inverting circuit 81a crosses the threshold level of the p-channel enhancement type field effect transistor 80af at time t25, and the row address bits and/or the complementary row address bits have already allowed the p-channel enhancement type field effect transistors 80ab to 80ae to turn on. Then, the output node of the step-up circuit 79 is coupled with the word line W1, and the word line W1 starts on increasing the voltage level to the read-out voltage level Vrd. If the word line W1 reaches the read-out voltage level Vrd at time t26, the write-in/read-out unit supplies current to the digit line D1 to see whether or not the memory cell M11 is in the write-in state, and produces an output data signal indicative of the state of the memory cell M11. The output data signal is supplied to the input/output data buffer unit 78 which in turn supplies the output data signal to the input/output data pin DP.

Thus, the electrically programmable read only memory device according to the present invention is equipped with the monitoring unit 81, and the read-out voltage level Vrd is supplied to the selected word line upon reaching the target voltage level. This results in that the timing t24 is hardly affected by fluctuation of process parameters, and the address set-up period is shrunk to the minimum.

The output signal of the monitoring unit 81 is available for another timing signal such as, for example, an activation signal supplied to a sense amplifier circuit, and current consumption is further decreased rather than production of the activation signal in a timing generating unit.

Second Embodiment

Figure 10:
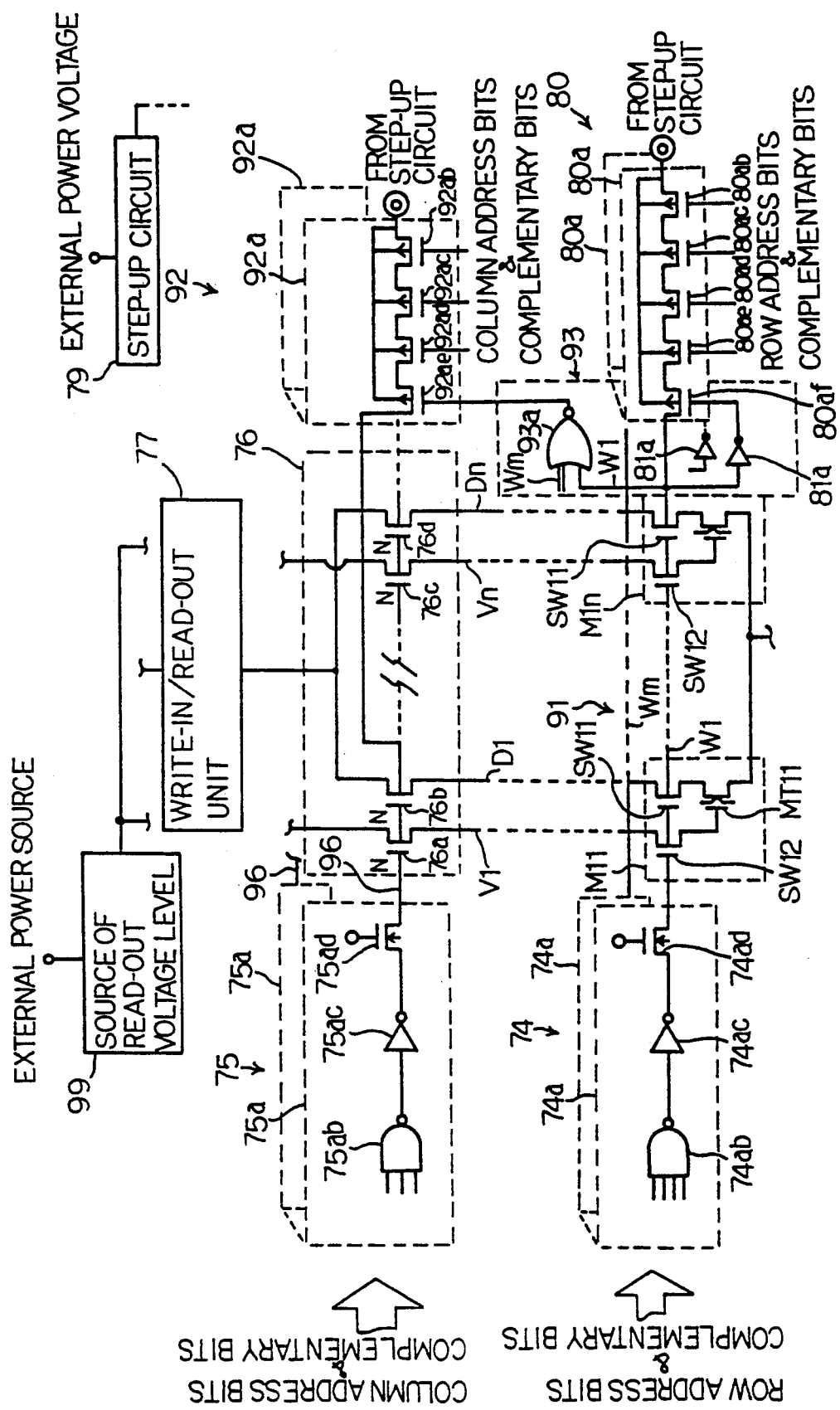
FIG. 10 is a circuit diagram showing the circuit arrangement of an essential part of another electrically programmable read only memory device according to the present invention.
Figure 11:
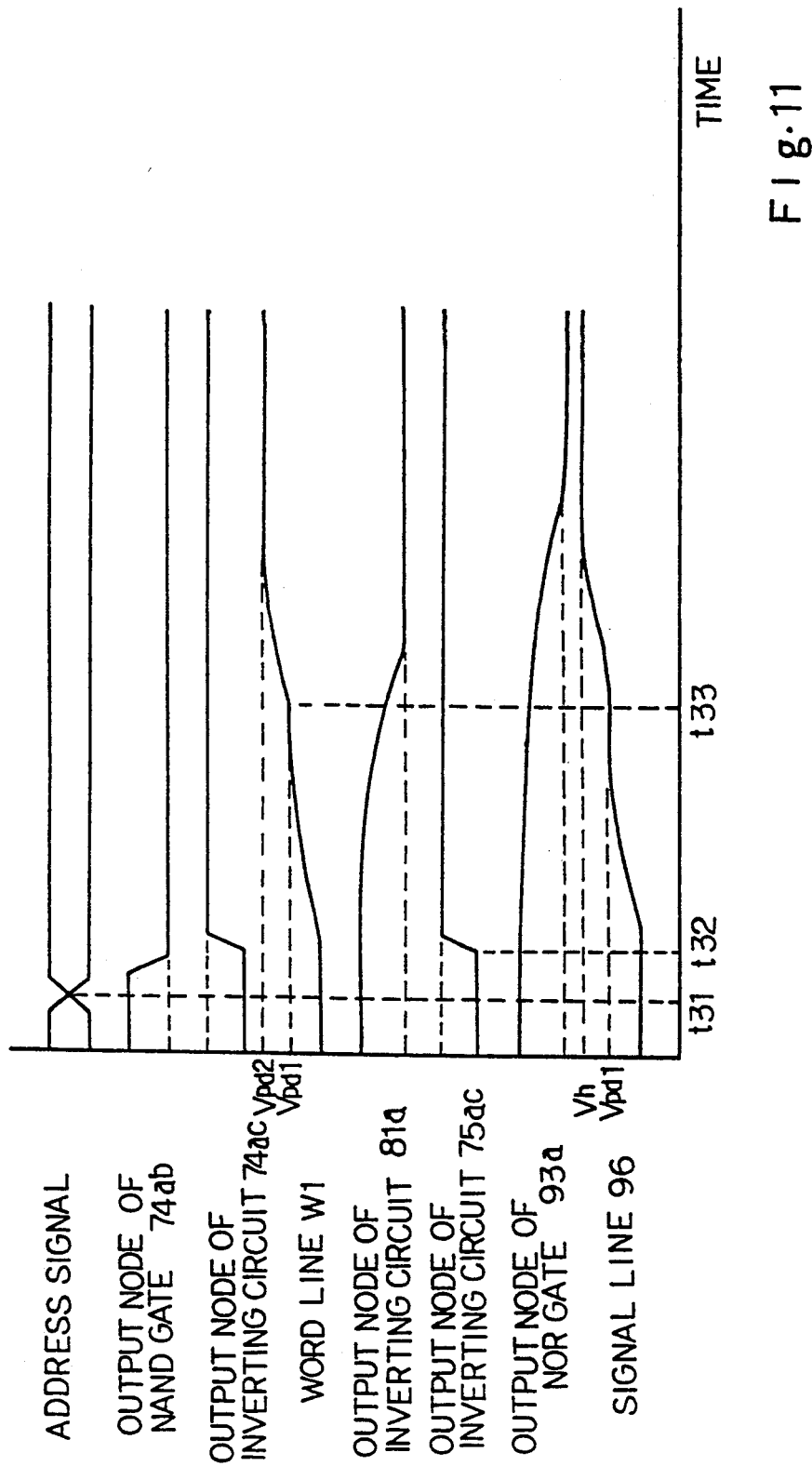
FIG. 11 is a timing chart showing a sequence of the read-out operation carried out by the electrically programmable read only memory device shown in FIG. 10.

Turning to FIG. 10 of the drawings, an essential part of another electrically programmable read only memory device is illustrated, and component units and transistors are labeled with the same references designating the corresponding units and transistors of the first embodiment without detailed description. The electrically programmable read only memory device implementing the second embodiment is of the type electrically erasable, and a high threshold voltage level and a low threshold voltage level are usually indicative of an erased state and a write-in state. However, the erased state and the write-in state respectively correspond to a low threshold level and a high threshold level in the following description for the sake of elimination of confusion.

In the electrically programmable read only memory device implementing the second embodiment, the memory cells M11 to M1n and the other memory cells forming a memory cell array 91 are of the type having a series combination of an n-channel floating gate memory transistor MT11 and an n-channel enhancement type switching transistor SW11 and an n-channel enhancement type field effect transistor SW12 coupled between the controlling gate electrode of the n-channel floating gate memory transistor MT11 and the associated voltage supply lines D1 to Dn. In order to supply a read-out voltage level Vrd to the controlling gate electrode of the selected memory cells, the associated word line should be lifted over the read-out voltage level Vrd. The column address decoding unit 75 is implemented by a plurality of column address decoding circuits including the decoding circuit 75a, and the column address decoding circuit 75a is provided for the n-channel enhancement type component switching transistors 76a and 76b of the column selecting unit 76. The column address decoding circuit 75a comprises a NAND gate 75ab, an inverting circuit 75ac and an n-channel enhancement type transfer transistor 75ad, and the other column address decoding circuits are similar to the column address decoding circuit 75a. For this reason, the other column address decoding circuits are labeled with 75a, and the other column address decoding circuits 75a are assigned to the other switching transistors such as 76c and 76d. The n-channel enhancement type field effect transistors 76b and 76d are coupled to the write-in/read-out unit 77 for selectively supplying read-out current to a selected digit line. On the other hand, the n-channel enhancement type field effect transistors 76a and 76c are coupled between a source of read-out voltage level 99 and the associated voltage supply lines D1 to Dn, and the source of read-out voltage level 99 produces the read-out voltage level Vrd.

A selecting unit 92 has a plurality of selecting circuits including a selecting circuit 92a, and the selecting circuit 92a is provided for the switching transistors 76a and 76b. The other selecting circuits are also labeled with the same reference 92a, and are associated with the other switching transistors such as 76c and 76d.

Each of the selecting circuits is implemented by a series combination of p-channel enhancement type field effect transistors 92ab, 92ac, 92ad and 92ae, and the column address bits and the complementary column address bits are selectively supplied to the p-channel enhancement type field effect transistors 92ab to 92ad. For this reason, if the column address decoding circuit 75a detects the column address bits indicative of the switching transistors 76a and 76b, the selecting circuit 92a allows the output node of the step-up circuit 79 to couple with the p-channel enhancement type field effect transistor 92ae.

A monitoring unit 93 comprises the inverting circuit 81a, other inverting circuits respectively associated with the other selecting circuits of the selecting unit 80, and a NOR gate 93a coupled to all of the word lines W1 to Wm. The p-channel enhancement type field effect transistor 92ae of every selecting circuit is gated by the NOR gate 93a, and the voltage level from the step-up circuit 79 is relayed from the p-channel enhancement type field effect transistor 92ad through the p-channel enhancement type field effect transistor 92ae to the associated switching transistors. In this instance, the word lines W1 to Wm are formed by polysilicon strips (not shown), and the signal lines between the column decoding circuit 75 and the column selecting unit 76 are of aluminum. For this reason, the signal line 96 from the column decoding unit 75 lifts the voltage level thereon faster than a selected word line. However, the NOR gate 93a keeps the p-channel enhancement type field effect transistor 92ae off, and the signal line 96 from the column decoding unit 75 is mostly lifted by the inverting circuit 75ac, thereby decreasing the load of the step-up circuit. Moreover, the NOR gate 93a is implemented by inverting circuits (not shown), and the inverting circuits 81a are of a ratio type having a p-channel type load transistor. By virtue of the ratio configuration, the number of the component transistors of the NOR gate 93a is about a half of the number of the component transistors of a NOR gate implemented by complementary inverting circuits. Although current of the order of several microampere is additionally consumed, the occupation area of the NOR gate 93a is surely reduced. The similar circuit component units are labeled with the same references in FIG. 10 without any detailed description.

The electrically programmable read only memory device implementing the second embodiment behaves as follows. Assuming now that the address signal is changed at time t31, the row address decoding circuit 74a lifts the word line W1 to the target voltage level, and the step-up circuit 79 further lifts the word line W1 to a second predetermined voltage level Vpd2 as similar to that of the first embodiment. The column address bits and the complementary column address bits causes the NAND gate 75ab to decay the output node thereof, and the selecting circuit 92a allows the p-channel enhancement type field effect transistors 92ab to 92ae to turn on with the column address bits and the complementary column address bits. The inverting circuit 75ac starts on increasing the signal line 96 toward the target voltage level, and the signal line 96 reaches the target voltage level faster than the word line W1. While the NOR gate 93a keeps the output node high, the signal line 96 remains in the target voltage level. However, if the word line W1 reaches the target voltage level at time t33, the NOR gate 93a shifts the output node below the threshold voltage level of the p-channel enhancement type field effect transistor 92ae, and the signal line 96 is lifted to a higher voltage level Vh.

Thus, not only the word line W1 but also the signal line 96 go up over the target voltage level, the read-out voltage level Vrd is supplied to the floating gate type memory transistor MT11, and the write-in/read-out unit 77 supplies read-out current to the digit line D1 to see whether or not the floating gate type memory transistor MT11 is in the write-in state.

Third Embodiment

Figure 12:
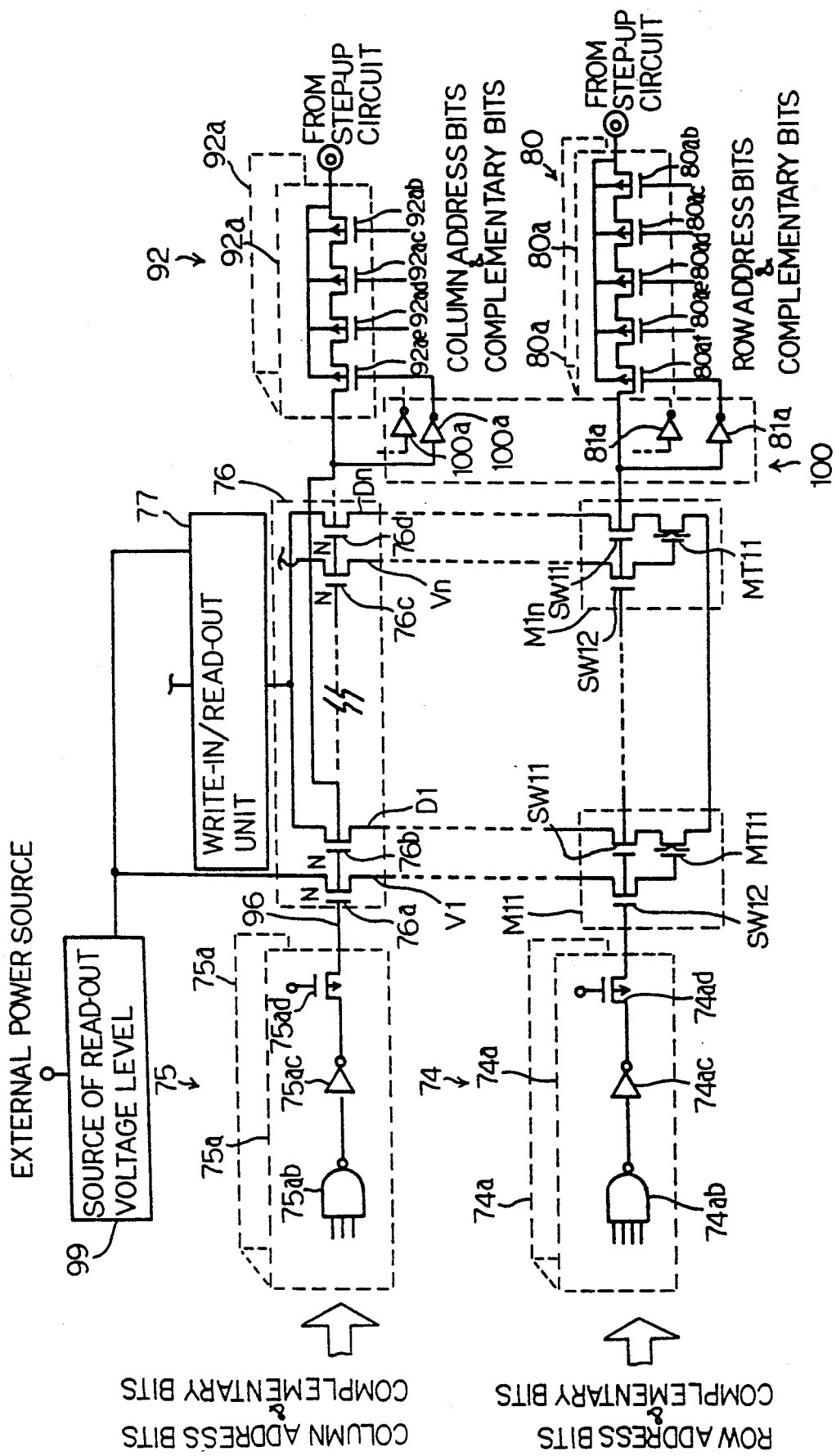
FIG. 12 is a circuit diagram showing the circuit arrangement of an essential part of yet another electrically programmable read only memory device according to the present invention.

Turning to FIG. 12 of the drawings, an essential part of yet another electrically programmable read only memory device is illustrated. The electrically programmable read only memory device implementing the third embodiment is similar to that of the second embodiment except for a monitoring unit 100, and component units, transistors and lines are labeled with the same references designating corresponding parts of the second embodiment without any detailed description for avoiding repetition.

The monitoring unit 100 comprises a plurality of inverting circuits respectively associated with the word lines and signal lines from the column address decoding unit 74, and the inverting circuits 81a and 100a are provided for the word line W1 and the signal line 96, respectively. All of the inverting circuits of the monitoring unit 100 are similar to the inverting circuit 81a incorporated in the electrically programmable read only memory device implementing the first embodiment, and, accordingly, shift the output voltage levels when the associated word line and the associated signal line reach the target voltage level. The similar circuit component units are labeled with the same references without detailed description.

Since the inverting circuit 100a is provided for the signal line 96, the selecting circuit 92a independently supplies the read-out voltage level Vrd to the signal line 96. However, the other parts of the read-out sequence are similar to those of the second embodiment, and no further description is incorporated hereinbelow.

Although particular embodiments of the present invention have been shown and described, it will be obvious to those skilled in the art that various changes and modifications may be made without departing from the spirit and scope of the present invention. For example, the electrically programmable read only memory device may be incorporated in a large scale integration, and another implementation may be electrically erasable and programmable.

What is claimed is:

1. An electrically programmable read only memory device comprising
   a) a plurality of memory cells arranged in rows and columns and respectively storing data bits, each of said plurality of memory cells being implemented by a field effect transistor having a source node coupled to a ground voltage line, a floating gate electrode covered with insulating film and provided between a channel forming region, a controlling gate electrode, and a drain node,
   b) a plurality of word lines respectively associated with said rows of said memory cells and coupled with controlling nodes of said memory cells in said associated rows,
   c) a plurality of digit lines respectively associated with said columns of said memory cells and coupled to second nodes of said memory cells in said associated columns,
   d) a row address decoding unit responsive to internal row address bits and shifting one of said plurality of word lines to a target voltage level, lower than a positive external power voltage level supplied from the outside thereof,
   e) a monitoring unit for monitoring said one of said plurality of word lines to see whether or not said one of said plurality of word lines reaches said target voltage level for producing a detecting signal indicative of reaching said target voltage level, including a plurality of inverting circuits respectively coupled to said word lines, each of said plurality of inverting circuits having a threshold level as high as said target voltage level for producing said detecting signal,
   f) step-up means responsive to said detecting signal and allowing said one of said plurality of word lines to exceed said target voltage level toward a predetermined voltage level larger in magnitude than said target voltage level, said one of said plurality of word lines allowing memory cells coupled thereto to enter a ready state, said step-up means comprising
      a step-up circuit supplied with said positive external power voltage level and producing said predetermined voltage level,
      a plurality of first switching transistors coupled with said word lines, respectively, and responsive to said detecting signal for producing conductive channels, and
      a selecting unit having a plurality of selecting circuits respectively associated with said plurality of word lines and responsive to said internal row address bits for interconnecting said step-up circuit and one of said plurality of first switching transistors,
   g) column selecting means responsive to internal column address bits and selecting one of said digit lines, and
   h) read-out means for discriminating a logic level of one of said data bits read out from one of said memory cells coupled to said one of said plurality of word lines and said one of said plurality of digit lines.

2. An electrically programmable read only memory device comprising
   a) a plurality of memory cells arranged in rows and columns and respectively storing data bits, said plurality of memory cells coupled with a constant voltage source, said plurality of memory cells having first switching transistors with respective gate electrodes, memory transistor respectively coupled in series with said first switching transistors and having respective floating gate electrodes and respective controlling gate electrodes stacked over respective channel forming regions, and second switching transistors having respective gate electrodes and coupled with said controlling gate electrodes of said memory transistors, respectively,
   b) a plurality of word lines respectively associated with said rows of said memory cells and coupled with said gate electrodes of said first and second switching transistors in said associated rows,
   c) a plurality of digit lines respectively associated with said columns of said memory cells and coupled with said first switching transistor in said associated columns,
   d) a plurality of voltage supply lines respectively associated with said columns of said memory cells and electrically connectable through said second switching transistors with said controlling gate electrodes of said memory transistors in said associated columns;
   e) a row address decoding unit responsive to internal row address bits and shifting one of said plurality of word lines to a target voltage level,
   f) a column selecting unit having third switching transistors having respective gate electrodes and respectively coupled with said plurality of digit lines, and a plurality of fourth switching transistors having respective gate electrodes and respectively coupled with said voltage supply lines, said plurality of third switching transistors being respectively paired with said fourth switching transistors for forming a plurality of switching transistor pairs, said fourth switching transistors being coupled with a source of read-out voltage level, g) a plurality of signal lines respectively associated with said switching transistor pairs and coupled with the gate electrodes of said third and fourth switching transistors of said associated switching transistor pairs, h) a read-out means supplying current to said third switching transistors for discriminating a logic level of a data bit read out from one of said memory cells coupled to said one of said word lines, i) a column address decoding unit responsive to internal column address bits and lifting one of said signal lines toward said target voltage level, j) a monitoring unit for monitoring said one of said plurality of word lines and said one of said signal lines to see whether or not said one of said plurality of word lines and said one of said signal lines reach said target voltage level for producing first and second detecting signals indicative of reaching said target voltage level, and k) step-up means responsive to said first and second detecting signals and allowing said one of said plurality of word lines and said one of said signal lines to exceed said target voltage level toward said predetermined voltage level.

3. An electrically programmable read only memory device as set forth in claim 2, in which said target voltage level is lower than a positive external power voltage level supplied from the outside thereof.

4. An electrically programmable read only memory device as set forth in claim 3, in which said step-up means comprises k-1) a step-up circuit supplied with said positive external power voltage level and producing said predetermined voltage level, k-2) a plurality of fifth switching transistors coupled with said word lines, respectively, and responsive to said first detecting signal for producing conductive channels, k-3) a first selecting unit having a plurality of selecting circuits respectively associated with said plurality of word lines and responsive to said internal row address bits for interconnecting said step-up circuit and one of said plurality of fifth switching transistors, k-4) a plurality of sixth switching transistors coupled to said plurality of signal lines, respectively, and responsive to said second detecting signal for producing conductive channels, and k-5) a second selecting unit having a plurality of selecting circuits respectively associated with said plurality of signal lines and responsive to said internal column address bits for interconnecting said step-up circuit and one of said plurality of sixth switching transistors.

5. An electrically programmable read only memory device as set forth in claim 4, in which said monitoring unit comprises j-1) a plurality of first inverting circuits respectively coupled to said word lines, each of said plurality of first inverting circuits having a threshold level as high as said target voltage level for producing said first detecting signal, and j-2) a logic gate coupled to said plurality of word lines and having a threshold level as high as said target voltage level for producing said second detecting signal.

6. An electrically programmable read only memory device as set forth in claim 4, in which said monitoring unit comprises j-1) a plurality of first inverting circuits respectively coupled to said word lines, each of said plurality of first inverting circuits having a threshold level as high as said target voltage level for producing said first detecting signal, and j-2) a plurality of second inverting circuits respectively coupled to said signal lines, each of said plurality of second inverting circuits having a threshold level as high as said target voltage level for producing said second detecting signal.

* * * * *